United States Patent
Jung et al.

(10) Patent No.: US 7,575,992 B2
(45) Date of Patent: *Aug. 18, 2009

(54) METHOD OF FORMING MICRO PATTERNS IN SEMICONDUCTOR DEVICES

(75) Inventors: Woo Yung Jung, Seoul (KR); Jong Hoon Kim, Seongnam-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 62 days.

This patent is subject to a terminal disclaimer.

(21) Appl. No.: 11/518,351

(22) Filed: Sep. 8, 2006

(65) Prior Publication Data

US 2007/0059914 A1    Mar. 15, 2007

(30) Foreign Application Priority Data

Sep. 14, 2005    (KR)    ..................... 10-2005-0085795

(51) Int. Cl.
  *H01L 21/44* (2006.01)
  *H01L 21/76* (2006.01)
  *H01L 21/4763* (2006.01)

(52) U.S. Cl. ................... 438/597; 438/424; 438/427; 438/640; 438/947; 257/906; 257/907; 257/908; 257/E27.087; 257/E27.088; 257/E27.131; 257/E27.152; 257/E21.656; 257/E21.657; 257/E21.658; 257/E21.659

(58) Field of Classification Search ........... 438/421, 438/424, 427, 462, 465, 944, 947, 640; 257/906–908, 257/E27.087, E27.088, E27.131, E27.152, 257/E21.656–E21.659

See application file for complete search history.

(56) References Cited

U.S. PATENT DOCUMENTS 5,328,810 A * 7/1994 Lowrey et al. .............. 430/313

(Continued)

FOREIGN PATENT DOCUMENTS

CN    1158495    9/1997

(Continued)

OTHER PUBLICATIONS

U.S. Appl. No. 11/475,319, filed Jun. 2006, Kim, Jong Hoon.*

(Continued)

*Primary Examiner*—Alexander G Ghyka
*Assistant Examiner*—Leonard Chang
(74) *Attorney, Agent, or Firm*—Marshall, Gerstein & Borun LLP

(57) ABSTRACT

A method of forming a micro pattern in a semiconductor device is disclosed. An oxide film mask is divided into a cell oxide film mask and a peri oxide film mask. Therefore, a connection between the cell and the peri region can be facilitated. A portion of a top surface of a first oxide film pattern between a region in which a word line will be formed and a region in which a select source line will be formed is removed. Accordingly, the space can be increased and program disturbance in the region in which the word line will be formed can be prevented. Furthermore, a pattern having a line of 50 nm and a space of 100 nm or a pattern having a line of 100 nm and a space of 50 nm, which exceeds the limitation of the ArF exposure equipment, can be formed using a pattern, which has a line of 100 nm and a space of 200 nm and therefore has a good process margin and a good critical dimension regularity.

5 Claims, 14 Drawing Sheets

U.S. PATENT DOCUMENTS

| | | | |
|---|---|---|---|
| 5,776,816 A | 7/1998 | Chen et al. | 438/401 |
| 6,861,180 B2 | 3/2005 | Chang | 430/5 |
| 6,955,961 B1 * | 10/2005 | Chung | 438/241 |
| 7,202,174 B1 * | 4/2007 | Jung et al. | 438/694 |
| 2002/0168590 A1 | 11/2002 | Hwang et al. | 430/313 |
| 2005/0266652 A1 * | 12/2005 | Chudzik et al. | 438/387 |
| 2006/0105273 A1 * | 5/2006 | Fukuda et al. | 430/313 |
| 2006/0292497 A1 * | 12/2006 | Kim | 430/313 |
| 2007/0158688 A1 * | 7/2007 | Caspary et al. | 257/208 |

FOREIGN PATENT DOCUMENTS

| | | | |
|---|---|---|---|
| JP | 10-150027 | | 6/1998 |
| KR | 1999-000089 | | 1/1999 |
| KR | 2001-0003465 | | 1/2001 |
| KR | 2001-0017089 | | 3/2001 |
| KR | 1020010017086 | * | 3/2001 |
| KR | 2002-0024415 | | 3/2002 |

OTHER PUBLICATIONS

Sax et al., "Polysilicon Overfill Etch Back Using Wet Chemical Spin-Process Technology", 1999, IEEE/SEMI Advanced Semiconductor Manufacturing Conference, pp. 1999-2004.*

Flounders, "Wet Etching of Silicon Nitride with Heated Phosphoric Acid", Aug. 29, 2004, UCB Microlab, pp. 1-2.*

* cited by examiner

METHOD OF FORMING MICRO PATTERNS IN SEMICONDUCTOR DEVICES

BACKGROUND OF THE INVENTION

1. Field of the Invention

The invention relates generally to a method of fabricating semiconductor devices and, more particularly, to a method forming a micro pattern in a semiconductor device, in which spaces between lines are formed differently and critical dimension (CD) can be controlled.

2. Discussion of Related Art

Exposure for the preparation of a 70 nm pattern size in semiconductor devices is conventionally performed using ArF exposure equipment. However, in order to form a pattern size of 50 nm or less, a method of forming a micro pattern through dual exposure etch has been proposed. However, the method cannot be applied to the process because it cannot control the overlay, which is the most important variable in the dual exposure.

The dual exposure will be described below with reference to FIGS. 1A and 1B.

Referring to FIG. 1A, exposure and development processes are firstly performed to form a photoresist pattern. A to-be etched layer that has first been exposed using the photoresist pattern as a mask is etched to form first line patterns 10 and first spaces 20. Each of the first line patterns 10 has a width of 100 nm and each of the first spaces 20 has a width of 100 nm.

Referring to FIG. 1B, exposure and development processes are then again performed to form a second photoresist pattern. The to-be etched layer that has been exposed a second time is etched to form second line patterns 30 and second spaces 40. Each of the second line patterns 30 has a width of 50 nm and each of the second spaces 40 has a width of 150 nm.

However, where after the pattern is first etched, exposure is performed a second time by aligning the overlay using an alignment key, the alignment key must be moved 50 nm to result in the pattern spacing shown in FIG. 1B. It is, however, difficult in practical terms to control the overlay accuracy of the exposure equipment to 10 nm or less.

In other words, in an ideal case, where a line pattern of 50 nm and a space of 150 nm are to be obtained, if misalignment occurs to the left side, a pattern width of 60 nm and a space of 140 nm are secured as shown in FIG. 2A. That is, a pattern of 50 nm or more is formed. On the other hand, if misalignment occurs to the right side, a pattern width of 40 nm and a space of 160 nm are secured as shown in FIG. 2B. Accordingly, it is possible to firm a pattern, but is impossible to control CD in terms of the process.

Furthermore, a method of forming a pattern having a pitch smaller than the resolution of the exposure equipment includes a pattern formation method employing double exposure technology (DET) or a spacer. However, with DET, it is difficult to overcome CD failure incurred by misalignment and this is not practical in actual device fabrication. Furthermore, in a pattern formation method employing the spacer, it is very difficult to connect the cell and the peri region and also difficult to form the lines and spaces of the cell differently. Accordingly, the pattern formation method employing the spacer is difficult to apply to actual device fabrication.

SUMMARY OF THE INVENTION

An embodiment of the invention relates to a method forming a micro pattern in a semiconductor device, in which critical dimension control is possible and spaces between the lines of a cell can be formed differently.

A method of forming minute patterns of a semiconductor device according to a first embodiment of the invention includes the steps of sequentially forming a first oxide film, a lower anti-reflection film, and a first photoresist film pattern on a semiconductor substrate, and then etching the lower anti-reflection film and the first oxide film using the first photoresist film pattern as a mask; stripping the first photoresist film pattern and the lower anti-reflection film, and then depositing a nitride film on the entire structure; blanket etching the nitride film to form spacers on sidewalls of the first oxide film; depositing a second oxide film on the entire structure and then polishing the second oxide film; and, forming a second photoresist film pattern on the entire structure, and then stripping the nitride film using the second photoresist film pattern as a mask, thus forming oxide film patterns.

A method of forming minute patterns of a semiconductor device according to a second embodiment of the invention includes the steps of sequentially forming a first oxide film, a lower anti-reflection film, and a first photoresist film pattern on a semiconductor substrate, and then etching the lower anti-reflection film and the first oxide film using the first photoresist film pattern as a mask; stripping the first photoresist film pattern and the lower anti-reflection film, and then depositing a nitride film on the entire structure; blanket etching the nitride film to form spacers on sidewalls of the first oxide film; depositing a second oxide film on the entire structure and then polishing the second oxide film; and forming a second photoresist film pattern on the entire structure, and then stripping the first and second oxide films using the second photoresist film pattern as a mask, thus forming oxide film patterns.

A method of forming minute patterns of a semiconductor device according to a third embodiment of the invention includes the steps of sequentially forming a first oxide film, a lower anti-reflection film, and a first photoresist film pattern on a semiconductor substrate, and then etching the lower anti-reflection film and the first oxide film using the first photoresist film pattern as a mask; stripping the first photoresist film pattern and the lower anti-reflection film, and then depositing a nitride film on the entire structure; blanket etching the nitride film to form spacers on sidewalls of the first oxide film; depositing a second oxide film on the entire structure and then polishing the second oxide film; and forming a second photoresist film pattern on the entire structure, and then stripping the nitride film and a part of the semiconductor substrate using the second photoresist film pattern as a mask, thus forming oxide film patterns.

A method of forming minute patterns of a semiconductor device according to a fourth embodiment of the invention includes the steps of sequentially forming a first oxide film, a lower anti-reflection film, and a first photoresist film pattern on a semiconductor substrate, and then etching the lower anti-reflection film and the first oxide film using the first photoresist film pattern as a mask; stripping the first photoresist film pattern and the lower anti-reflection film, and then depositing a nitride film on the entire structure; blanket etching the nitride film to form spacers on sidewalls of the first oxide film; depositing a second oxide film on the entire structure and then polishing the second oxide film; and forming a second photoresist film pattern on the entire structure, and then stripping the nitride film, a portion of the first and second oxide films, and a portion of the semiconductor substrate using the second photoresist film pattern as a mask, thus forming oxide film patterns.

A method of forming a micro pattern in a semiconductor device according to a fifth embodiment of the invention includes the steps of forming a hard mask film and a first oxide film on a semiconductor substrate and etching the first oxide film to form first oxide film patterns; forming spacers on sidewalls of the first oxide film patterns, forming a second oxide film on the entire structure, and polishing the second oxide film until a predetermined width of each spacer is exposed; stripping the spacers, and forming a word line space mask pattern on the semiconductor substrate so that only a space portion between a region in which a word line will be formed and a region in which a select source line will be formed is opened; removing a portion of a top surface of the first oxide film patterns between the region in which the word line will be formed and the region in which the select source line will be formed and then performing dip to control a width of each of the first oxide film patterns and a width of the space; and etching the second oxide film of a peri region to form an oxide film pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

FIGS. 3A to 3G are cross-sectional views illustrating a method of forming a micro pattern in a semiconductor device according to a first embodiment of the invention.

Figure 1A:
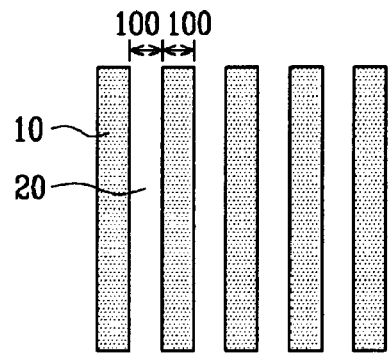
FIGS. 1A and 1B are plan views illustrating a method of forming a micro pattern in a semiconductor device in the prior art.
Figure 1B:
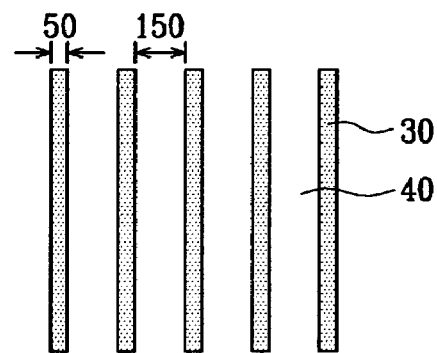
Figure 2A:
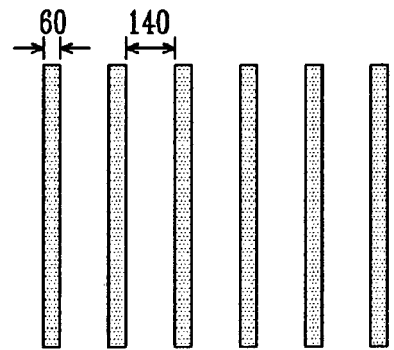
FIGS. 2A and 2B are plan views illustrating problems occurring when the prior art is applied.
Figure 2B:
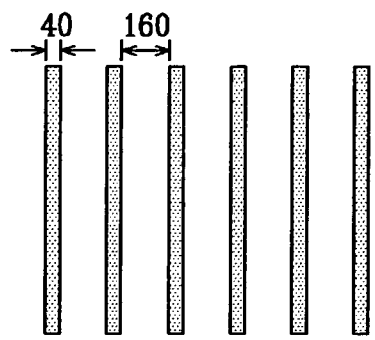
Figure 3A:
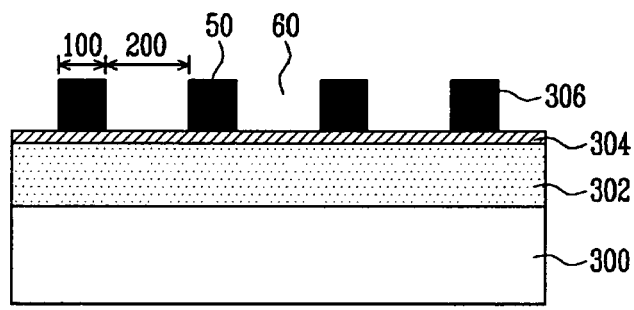
FIGS. 3A to 3G are cross-sectional views illustrating a method of forming a micro pattern in a semiconductor device according to a first embodiment of the invention.

Referring to FIG. 3A, a first oxide film 302 and a lower anti-reflection film 304 are sequentially formed on a semiconductor substrate 300. A photoresist film is formed on the lower anti-reflection film 304. The first oxide film 302 may preferably be formed to a thickness of 100 Å to 10000 Å. The photoresist film is patterned through exposure and development, thus forming first photoresist patterns 306 respectively having a line 50 of 100 nm and a space 60 of 200 nm.

Figure 3B:
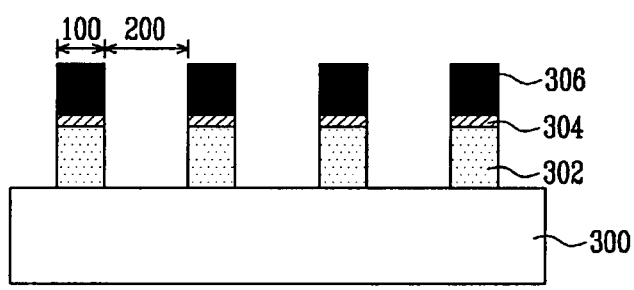

Referring to FIG. 3B, the lower anti-reflection film 304 and the first oxide film 302 are sequentially etched using the first photoresist patterns 306 as a mask, thus securing spaces of 100 nm and spaces of 200 nm.

Figure 3C:
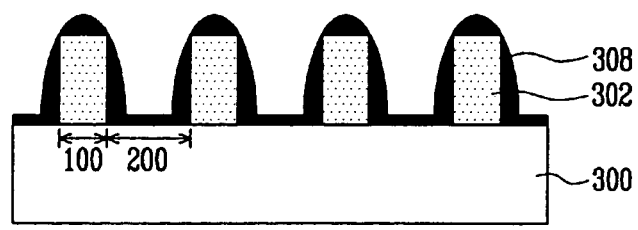

Referring to FIG. 3C, after the first photoresist patterns 306 and the lower anti-reflection film 304 are stripped, a nitride film 308 is formed on the entire structure. The nitride film 308 may be preferably formed to a thickness of 100 Å to 10000 Å.

Figure 3D:
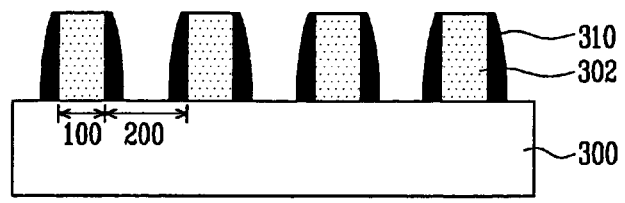

Referring to FIG. 3D, the nitride film 308 is blanket etched to form a spacer 310 on the sidewall of the first oxide film 302. The critical dimension (CD) of the spacer 310 is illustratively 50 nm. The spacer 310 may be formed using an oxide film, a nitride film, a polysilicon film, a tungsten film, an aluminum film, or a high density plasma, for example.

Figure 3E:
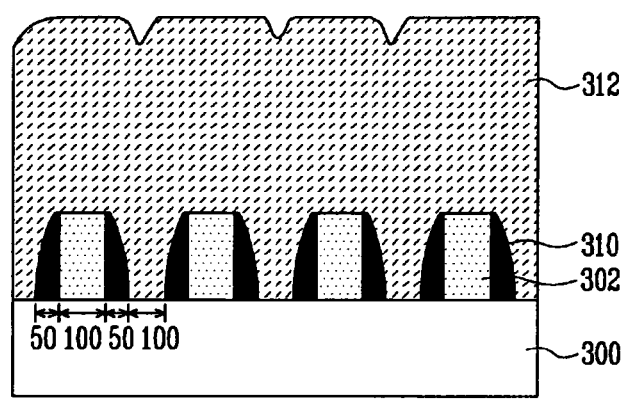

Referring to FIG. 3E, a second oxide film 312 is formed on the entire structure. The second oxide film 312 may preferably be formed to a thickness of 5000 Å to 30000 Å. The second oxide film 312 may preferably be formed using a high density plasma (HDP) oxide film, a nitride film, or a polysilicon film, for example.

Figure 3F:
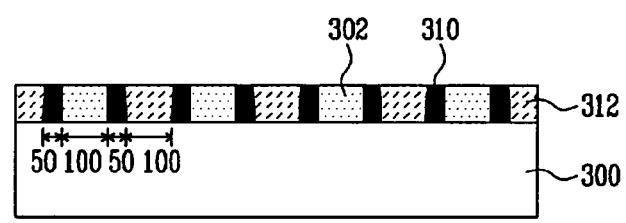

Referring to FIG. 3F, a chemical mechanical polishing (CMP) process is performed so that the second oxide film 312 has a predetermined thickness. It is preferred that the second oxide film 312 has a thickness of about 500 Å to 30000 Å. If CMP is carried out using the second oxide film 312 as a target, the slope of the spacer top portion at which the spacer (i.e., the nitride film) is formed can be controlled by controlling the CMP target. Accordingly, the CMP process of polishing the second oxide film 312 decides the CD of a pattern that will be finally formed. As a result, if the process condition is prepared by regularizing the CD through SEM photographs, TEM photograph, etc. depending on the CMP process target, the CD can be controlled.

Figure 3G:
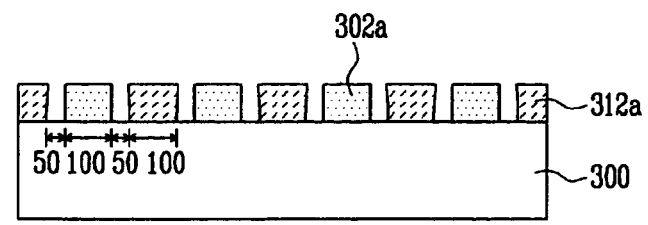

Referring to FIG. 3G, a photoresist film is formed on the entire structure. Exposure and development processes are then performed to form a photoresist pattern (not shown). The spacers 310 (i.e., the nitride film) are stripped using the photoresist pattern as a mask, thereby forming oxide film patterns 302a and 312a having a line of 100 nm and a space of 50 nm.

In the exposure process, the photoresist pattern is formed by forming a photoresist film on the entire structure using a light source, such as i-ray having a wavelength of 365 nm, KrF laser having a wavelength of 248 nm, ArF laser having a wavelength of 193 nm, or extreme ultraviolet (EUV) having a wavelength of 157 nm, for example, and then performing exposures using a light source, such as i-ray having a wavelength of 365 nm, KrF laser having a wavelength of 248 nm, ArF laser having a wavelength of 193 nm, or EUV having a wavelength of 157 nm, for example.

FIG. 4A to FIG. 4G are cross-sectional views illustrating a method of forming a micro pattern in a semiconductor device according to a second embodiment of the invention.

Figure 4A:
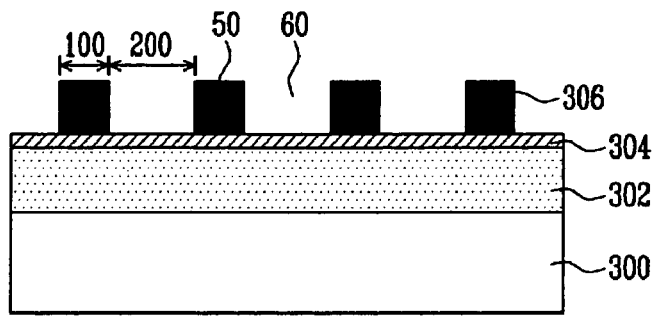
FIG. 4A to FIG. 4G are cross-sectional views illustrating a method of forming a micro pattern in a semiconductor device according to a second embodiment of the invention.

Referring to FIG. 4A, a first oxide film 302 and a lower anti-reflection film 304 are sequentially formed on a semiconductor substrate 300. A photoresist film is formed on the lower anti-reflection film 304. The first oxide film 302 may preferably be formed to a thickness of 100 Å to 10000 Å. The photoresist film is patterned through exposure and development, thus forming first photoresist patterns 306 respectively having a line 50 of 100 nm and a space 60 of 200 nm.

Figure 4B:
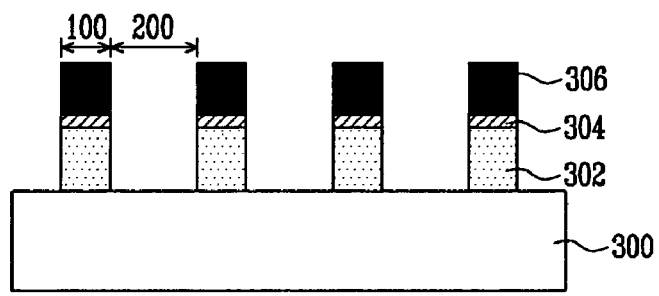

Referring to FIG. 4B, the lower anti-reflection film 304 and the first oxide film 302 are sequentially etched using the first photoresist patterns 306 as a mask, thus securing spaces of 100 nm and spaces of 200 nm.

Figure 4C:
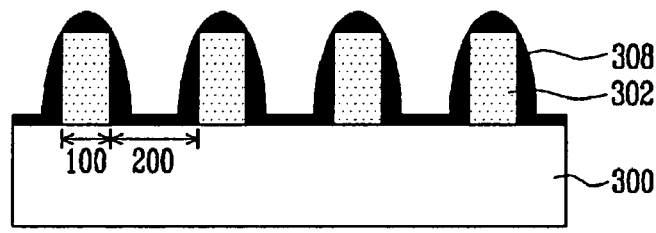

Referring to FIG. 4C, after the first photoresist patterns 306 and the lower anti-reflection film 304 are stripped, a nitride film 308 is formed on the entire structure. The nitride film 308 may preferably be formed to a thickness of 100 Å to 10000 Å.

Figure 4D:
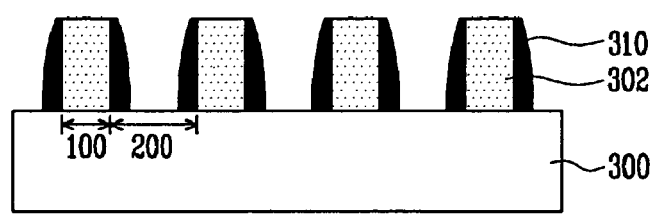

Referring to FIG. 4D, the nitride film 308 is blanket etched to form a spacer 310 on the sidewall of the first oxide film 302. The CD of the spacer 310 is 50 nm. The spacer 310 may preferably be formed using an oxide film, a nitride film, a polysilicon film, a tungsten film, or an aluminum film, for example.

Figure 4E:
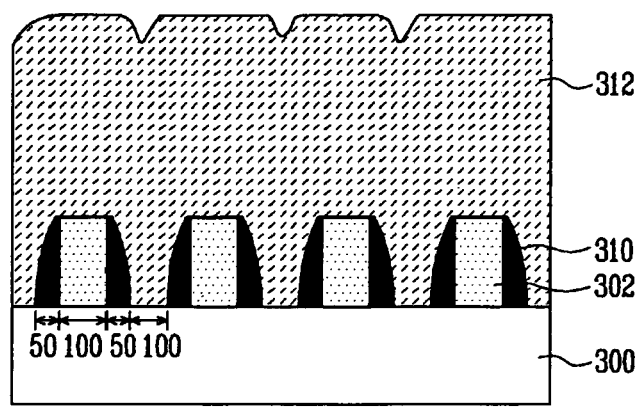

Referring to FIG. 4E, a second oxide film 312 is formed on the entire structure. The second oxide film 312 may preferably be formed to a thickness of 5000 Å to 30000 Å. The second oxide film 312 may preferably be formed using a HDP oxide film, a nitride film or a polysilicon film, for example.

Figure 4F:
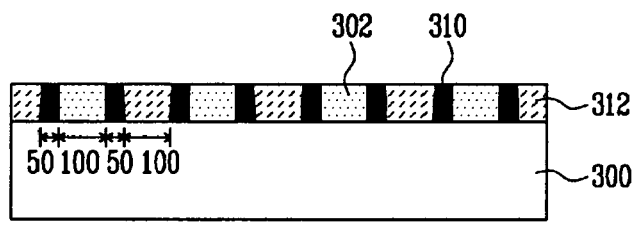

Referring to FIG. 4F, a chemical mechanical polishing (CMP) process is performed so that the second oxide film 312 has a predetermined thickness. It is preferred that the second oxide film 312 has a thickness of about 500 Å to 30000 Å. If CMP is carried out using the second oxide film 312 as a target, the slope of the spacer top portion at which the spacer (i.e., the nitride film) is formed can be controlled by controlling the CMP target. Accordingly, the CMP process of polishing the second oxide film 312 decides the CD of a pattern that will be finally formed. As a result, if the process condition is prepared by regularizing the CD through SEM photographs, TEM photograph, etc. depending on the CMP process target, the CD can be controlled.

Figure 4G:
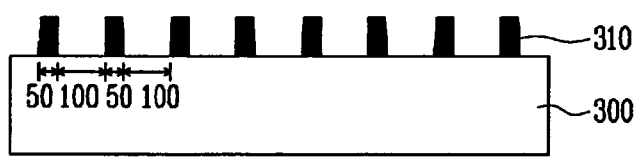

Referring to FIG. 4G, a photoresist film is formed on the entire structure. Exposure and development processes are then performed to form a photoresist pattern (not shown). The first and second oxide films 302 and 312 are stripped using the photoresist pattern as a mask, thereby forming nitride film patterns 310 having a line of 50 nm and a space of 100 nm.

FIGS. 5A to 5G are cross-sectional views illustrating a method of forming a micro pattern in a semiconductor device according to a third embodiment of the invention.

Figure 5A:
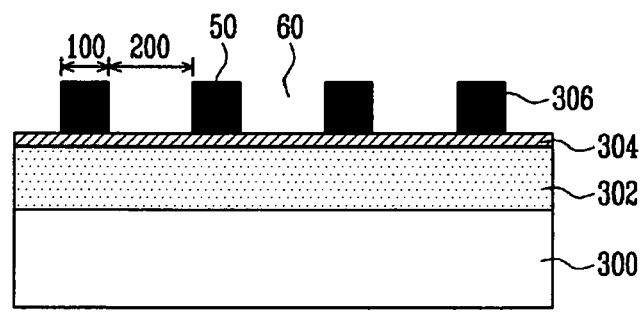
FIGS. 5A to 5G are cross-sectional views illustrating a method of forming a micro pattern in a semiconductor device according to a third embodiment of the invention.

Referring to FIG. 5A, a first oxide film 302 and a lower anti-reflection film 304 are sequentially formed on a semiconductor substrate 300. A photoresist film is formed on the lower anti-reflection film 304. The first oxide film 302 may preferably be formed to a thickness of 100 Å to 10000 Å. The photoresist film is patterned through exposure and development, thus forming first photoresist patterns 306 respectively having a line 50 of 100 nm and a space 60 of 200 nm.

Figure 5B:
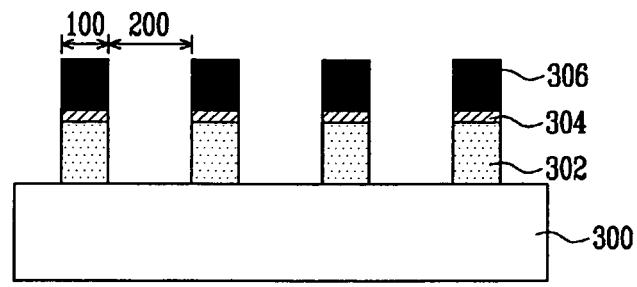

Referring to FIG. 5B, the lower anti-reflection film 304 and the first oxide film 302 are sequentially etched using the first photoresist patterns 306 as a mask, thus securing spaces of 100 nm and spaces of 200 nm.

Figure 5C:
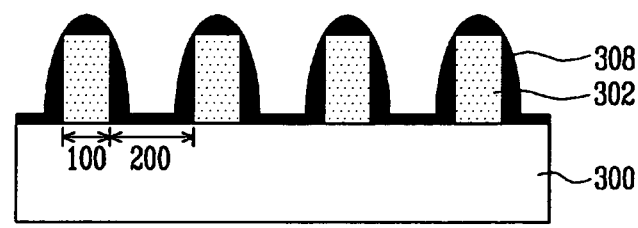

Referring to FIG. 5C, after the first photoresist patterns 306 and the lower anti-reflection film 304 are stripped, a nitride film 308 is formed on the entire structure. The nitride film 308 may preferably be formed to a thickness of 100 Å to 10000 Å.

Figure 5D:
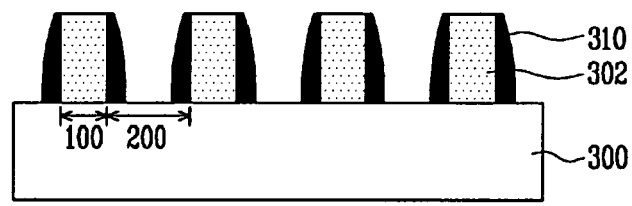

Referring to FIG. 5D, the nitride film 308 is blanket etched to form a spacer 310 on the sidewall of the first oxide film 302. The CD of the spacer 310 is 50 nm. The spacer 310 may be formed using an oxide film, a nitride film, a polysilicon film, a tungsten film, or an aluminum film, for example.

Figure 5E:
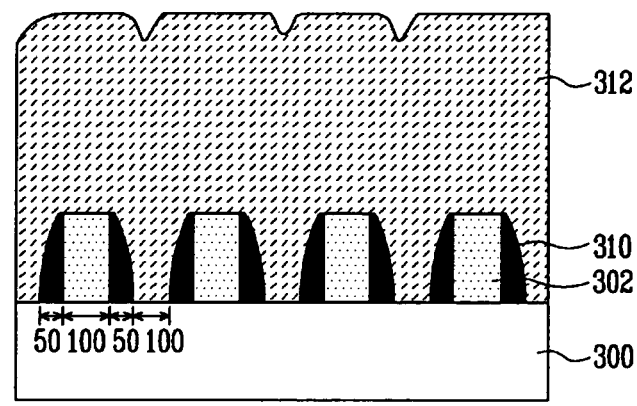

Referring to FIG. 5E, a second oxide film 312 is formed on the entire structure. The second oxide film 312 may preferably be formed to a thickness of 5000 Å to 30000 Å. The second oxide film 312 may preferably be formed using a HDP oxide film, a nitride film, or a polysilicon film, for example.

Figure 5F:
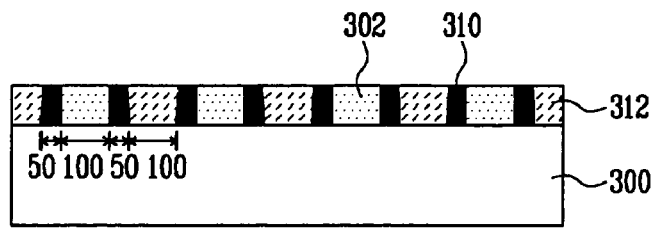

Referring to FIG. 5F, a chemical mechanical polishing (CMP) process is performed so that the second oxide film 312 has a predetermined thickness. It is preferred that the second oxide film 312 has a thickness of about 500 Å to 30000 Å. If CMP is carried out using the second oxide film 312 as a target, the slope of the spacer top portion at which the spacer (i.e., the nitride film) is formed can be controlled by controlling the CMP target. Accordingly, the CMP process of polishing the second oxide film 312 decides the CD of a pattern that will be finally formed. As a result, if the process condition is prepared by regularizing the CD through SEM photographs, TEM photograph, etc. depending on the CMP process target, the CD can be controlled.

Figure 5G:
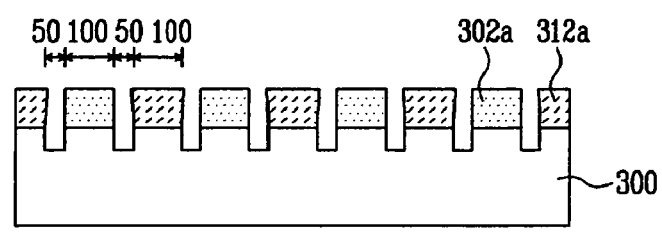

Referring to FIG. 5G, a photoresist film is formed on the entire structure. Exposure and development processes are then performed to form a photoresist pattern (not shown). The spacers 310 (i.e., the nitride film) and a portion of the semiconductor substrate 100 are etched using the photoresist pattern as a mask, thus forming oxide film patterns 302a and 312a having a line of 100 nm and a space of 50 nm.

FIGS. 6A to 6G are cross-sectional views illustrating a method of forming a micro pattern in a semiconductor device according to a fourth embodiment of the invention.

Figure 6A:
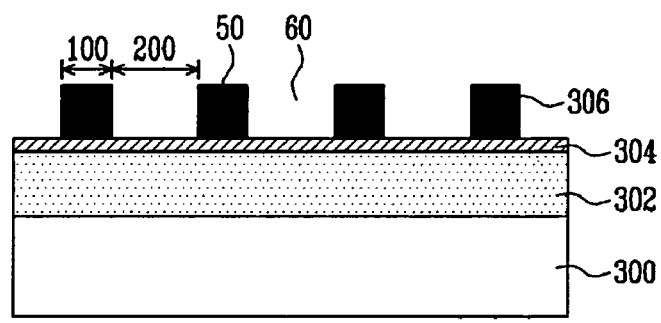
FIGS. 6A to 6G are cross-sectional views illustrating a method of forming a micro pattern in a semiconductor device according to a fourth embodiment of the invention.

Referring to FIG. 6A, a first oxide film 302 and a lower anti-reflection film 304 are sequentially formed on a semiconductor substrate 300. A photoresist film is formed on the lower anti-reflection film 304. The first oxide film 302 may preferably be formed to a thickness of 100 Å to 10000 Å. The photoresist film is patterned through exposure and development, thus forming first photoresist patterns 306 respectively having a line 50 of 100 nm and a space 60 of 200 nm.

Figure 6B:
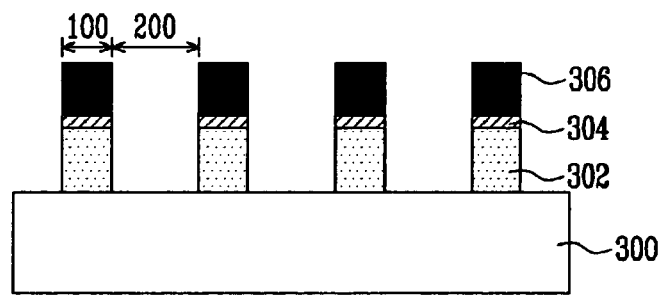

Referring to FIG. 6B, the lower anti-reflection film 304 and the first oxide film 302 are sequentially etched using the first photoresist patterns 306 as a mask, thus securing spaces of 100 nm and spaces of 200 nm.

Figure 6C:
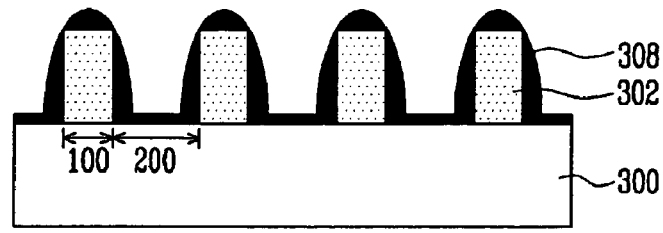

Referring to FIG. 6C, after the first photoresist patterns 306 and the lower anti-reflection film 304 are stripped, a nitride film 308 is formed on the entire structure. The nitride film 308 may preferably be formed to a thickness of 100 Å to 10000 Å.

Figure 6D:
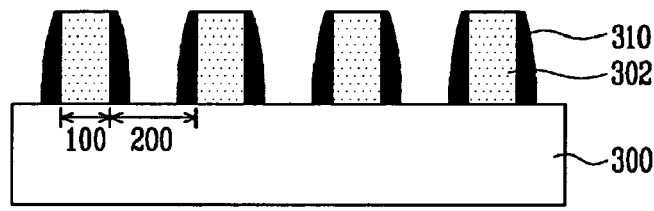

Referring to FIG. 6D, the nitride film 308 is blanket etched to form a spacer 310 on the sidewall of the first oxide film 302. The CD of the spacer 310 is 50 nm. The spacer 310 may be formed using an oxide film, a nitride film, a polysilicon film, a tungsten film, or an aluminum film, for example.

Figure 6E:
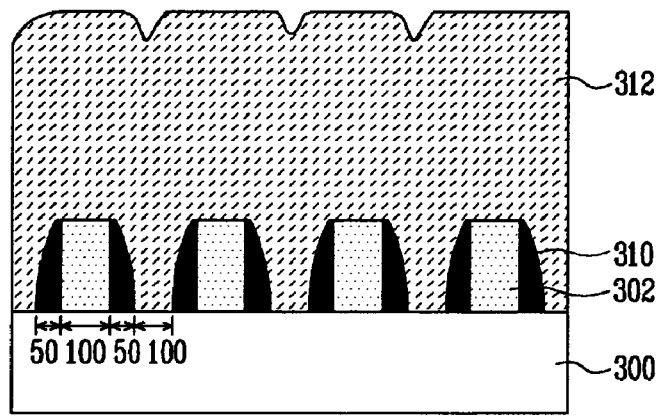

Referring to FIG. 6E, a second oxide film 312 is formed on the entire structure. The second oxide film 312 may preferably be formed to a thickness of 5000 Å to 30000 Å. The second oxide film 312 may preferably be formed using a HDP oxide film, a nitride film, or a polysilicon film, for example.

Figure 6F:
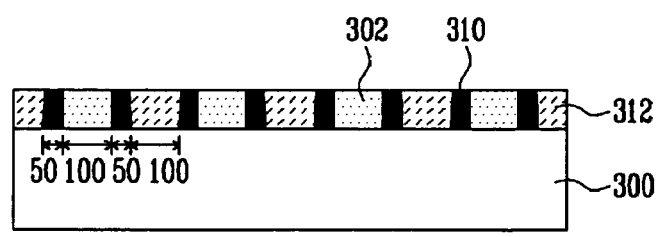

Referring to FIG. 6F, a chemical mechanical polishing (CMP) process is performed so that the second oxide film 312 has a predetermined thickness. It is preferred that the second oxide film 312 has a thickness of about 500 Å to 30000 Å. If CMP is carried out using the second oxide film 312 as a target, the slope of the spacer top portion at which the spacer (i.e., the nitride film) is formed can be controlled by controlling the CMP target. Accordingly, the CMP process of polishing the second oxide film 312 decides the CD of a pattern that will be finally formed. As a result, if the process condition is prepared by regularizing the CD through SEM photographs, TEM photograph, etc. depending on the CMP process target, the CD can be controlled.

Figure 6G:
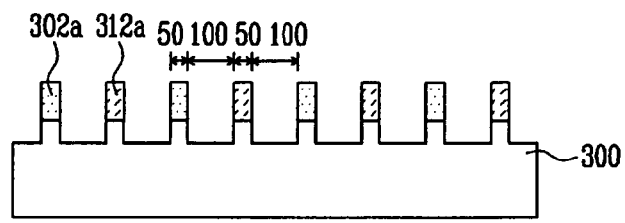

Referring to FIG. 6G, a photoresist film is formed on the entire structure. Exposure and development processes are then performed to form a photoresist pattern (not shown). The spacers 310 (i.e., the nitride film), a portion of the first and second oxide films 302 and 312, and a portion of the semiconductor substrate 100 are etched using the photoresist pattern as a mask, thus forming oxide film patterns 302a and 312a having a line of 50 nm and a space of 100 nm. Accordingly, the CD of a pattern having a line of 50 nm and a space of 100 nm or a pattern having a line of 100 nm and a space of 50 nm can be easily controlled using a pattern having a line of 100 nm and a space of 200 nm. It is also possible to secure the CD regularity.

FIGS. 7A to 7J are plan views illustrating a method of forming a micro pattern in a semiconductor device according to a fifth embodiment of the invention. FIGS. 8A to 8K are cross-sectional views illustrating the method of forming the micro pattern in the semiconductor device according to the fifth embodiment of the present invention.

Figure 7A:
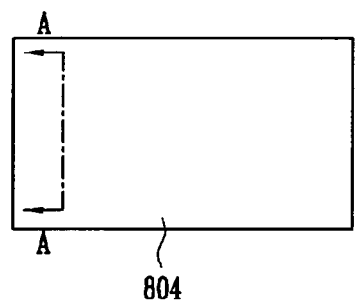
FIGS. 7A to 7J are plan views illustrating a method of forming a micro pattern in a semiconductor device according to a fifth embodiment of the invention.
Figure 8A:
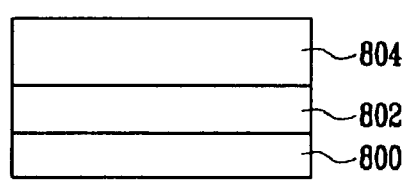
FIGS. 8A to 8K are cross-sectional views illustrating the method of forming the micro pattern in the semiconductor device according to the fifth embodiment of the invention.

FIG. 8A is a cross-sectional view of the semiconductor device taken along line A-A in FIG. 7A. A hard mask film 802 is formed on a semiconductor substrate 800. The hard mask film 802 may be formed of a tungsten film or a polysilicon film, for example. A first oxide film 804 is formed on the hard mask film 802.

Figure 7B:
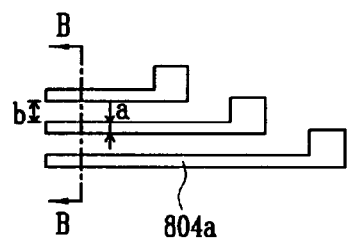
Figure 8B:
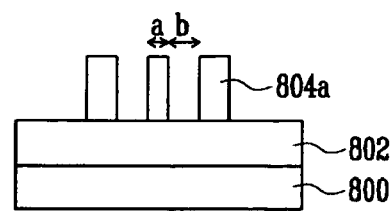

FIG. 8B is a cross-sectional view of the semiconductor device taken along line B-B in FIG. 7B. The first oxide film 804 is etched using a cell oxide film mask (not shown), forming first oxide film patterns 804a. In the cell oxide film mask, only patterns interconnected to the cell are formed. A width "a" of the first oxide film patterns 804a of the cell region must be smaller than a half a pitch "b".

Figure 7C:
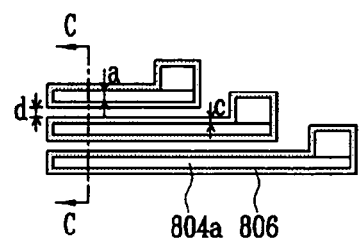
Figure 8C:
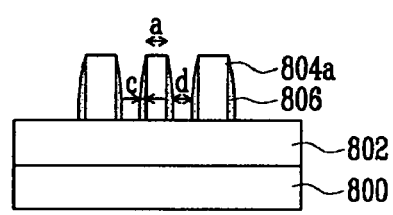

FIG. 8C is a cross-sectional view of the semiconductor device taken along line C-C in FIG. 7C. A nitride film is formed on the semiconductor substrate 800. The nitride film is etched until a top surface of the first oxide film patterns 804a is exposed, thus forming spacers 806 on the sidewalls of the first oxide film patterns 804a. It is required that the sum of a width "c" of each spacer 806 and a width "a" of each first oxide film pattern 804a must be a half a pitch "b".

Figure 8D:
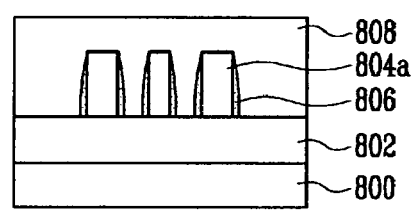

Referring to FIG. 8D, a second oxide film 808 is formed on the entire structure such that between-the first oxide film patterns 804a is buried.

Figure 7D:
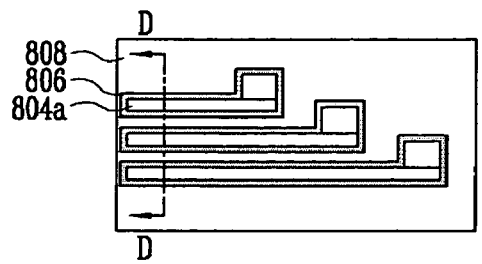
Figure 8E:
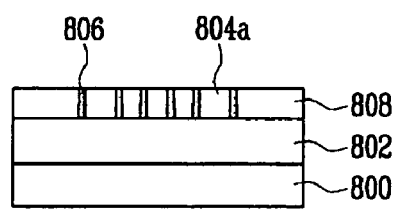

FIG. 8E is a cross-sectional view of the semiconductor device taken along line D-D in FIG. 7D. CMP is performed until the width "c" of the spacer 806 is exposed at a predetermined thickness.

Figure 7E:
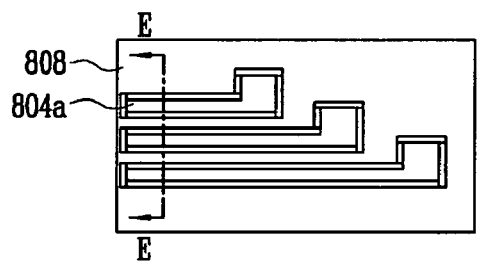
Figure 8F:
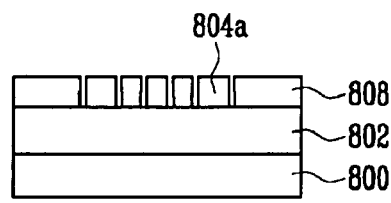

FIG. 8F is a cross-sectional view of the semiconductor device taken along line E-E in FIG. 7E. The spacers 806 are removed by wet etch.

Figure 7F:
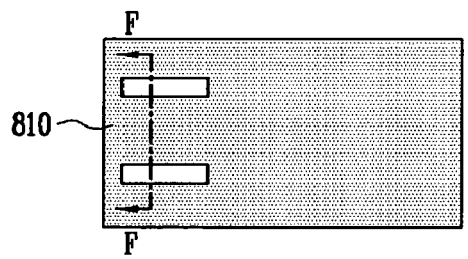
Figure 8G:
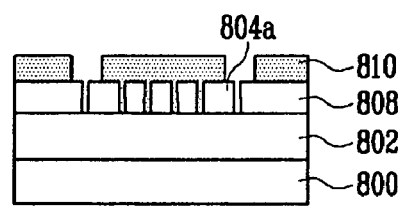

FIG. 8G is a cross-sectional view of the semiconductor device taken along line F-F in FIG. 7F. A word line (WL) space mask is formed on the semiconductor substrate 800. In order to prevent program disturbance of a word line WL to be formed and to increase a space between a region in which WL will be formed and a region in which SSL "Source Select Line" will be formed, exposure is performed on the WL space mask so that only the space between the region in which WL will be formed and the region in which SSL will be formed is opened, thus forming a WL space mask pattern 810.

Figure 7G:
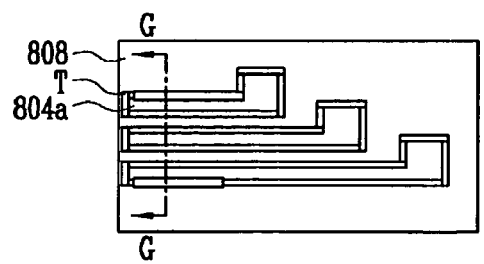
Figure 8H:
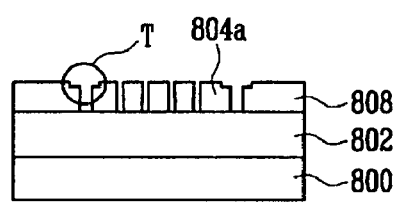

FIG. 8H is a cross-sectional view of the semiconductor device taken along line G-G in FIG. 7G. Dip is performed to remove a portion of a tops surface of the first oxide film patterns 804a between the region in which the exposed WL will be formed and the region in which SSL will be formed, thereby securing spaces. The reason why dip is used rather than dry etch is that a width of the first oxide film pattern 804a is not changed although misalignment occurs.

Figure 7H:
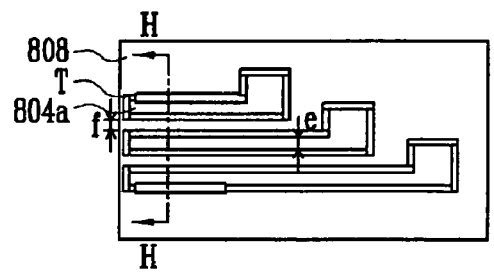
Figure 8I:
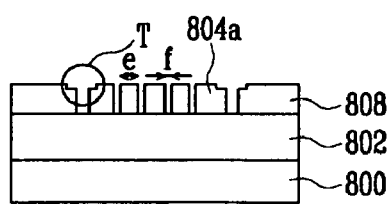

FIG. 8I is a cross-sectional view of the semiconductor device taken along line H-H in FIG. 7H. After the WL space mask pattern 810 is stripped, dip is performed in order to control a width "e" of the first oxide film pattern 804a and a width "f" of the space.

Figure 7I:
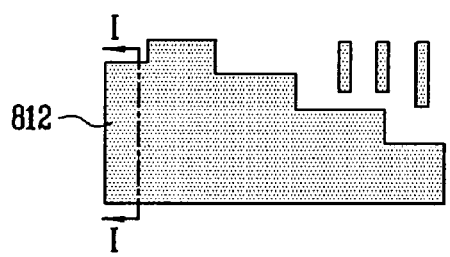
Figure 8J:
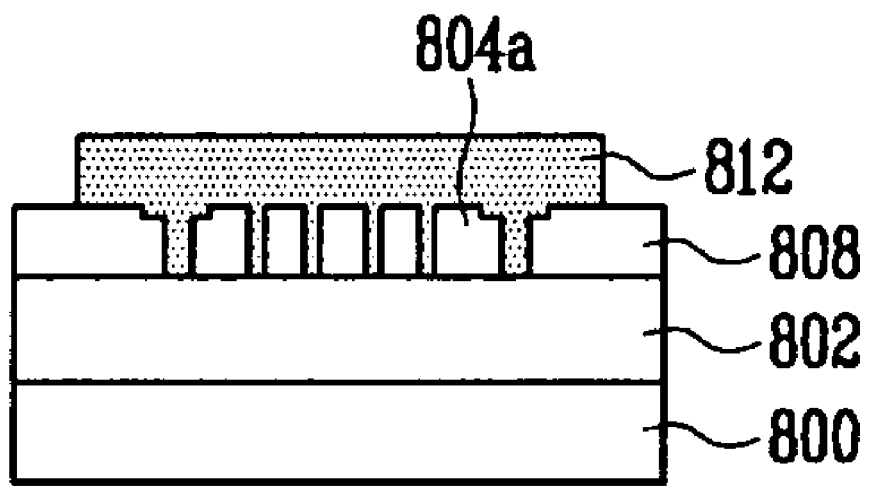

FIG. 8J is a cross-sectional view of the semiconductor device taken along line I-I in FIG. 7I. A peri oxide film mask 812 is formed on the semiconductor substrate 800 except for the peri region. In the peri gate mask 812, the cell portion has experienced Cr processing and is opened on the basis of the interconnection portion. Accordingly, a pad can be formed every region in which each WL will be formed and peri transistors can be also formed in the region.

Figure 7J:
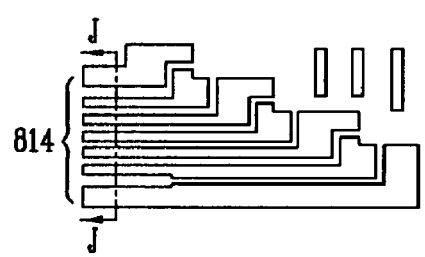
Figure 8K:
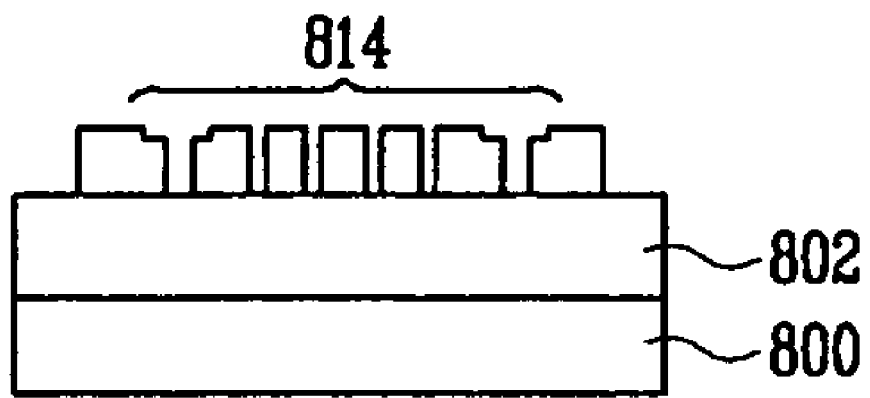

FIG. 8K is a cross-sectional view of the semiconductor device taken along line J-J in FIG. 7J. The second oxide film 808 of the peri region is etched using the peri oxide film mask 812, forming oxide film patterns 814.

Since the first and second oxide film patterns 804 and 808 formed of the oxide film patterns 814 are relatively thin, the first and second oxide film patterns 804 and 808 are insufficient to serve as a hard mask. Accordingly, the tungsten film or the polysilicon film (i.e., the underlying hard mask film 802) is etched in order to utilize it as the hard mask.

As described above, according to the invention, a pattern having a line of 50 nm and a space of 100 nm or a pattern having a line of 100 nm and a space of 50 nm, which exceeds the limitation of the ArF exposure equipment, can be formed using a pattern, which has a line of 100 nm and a space of 200 nm and therefore has a good process margin and a good CD regularity.

Furthermore, the pitch between the cell oxide film pattern and the oxide film pattern can be reduced without increasing the resolution of the exposure equipment. It is also possible to form an oxide film pattern having a wavelength of 29 nm, which is ½ of 58 nm, using only an exposure apparatus ASML XT1400 and to fabricate 16G multi-level cell (MLC) NAND flash using only ASML XT1400.

While the invention has been described in connection with practical exemplary embodiments, the invention is not limited to the disclosed embodiments but, on the contrary, is intended to cover various modifications and equivalent arrangements included within the spirit and scope of the appended claims.

What is claimed is:

1. A method of forming a micro pattern in a semiconductor device, comprising:
   sequentially forming a hard mask film and a first oxide film on a semiconductor substrate and etching the first oxide film to form first oxide film patterns;
   forming spacers on sidewalls of the first oxide film patterns, forming a second oxide film on the entire structure, and polishing the second oxide film until a predetermined width of each spacer is exposed to form second oxide film patterns;
   stripping the spacers between the first and second oxide film patterns, and forming a word line space mask pattern on the semiconductor substrate so that a space portion between the first and second oxide film patterns is exposed;
   removing a portion of a top surface of the first oxide film patterns in the space portion using the word line space mask pattern as an etch mask;
   performing a dip to control a width of the space between the first and second oxide film patterns after removing the word line space mask pattern; and
   etching the second oxide film of a peri region to form an oxide film pattern.

2. The method of claim 1, wherein the hard mask film comprises a tungsten film or a polysilicon film.

3. The method of claim 1, comprising stripping the spacers using a wet etch process.

4. The method of claim 1, comprising removing the portion of the top surface of the first oxide film pattern in the space portion by performing a dip.

5. The method of claim 1, wherein a portion of a top surface of the second oxide film pattern is removed when the portion of the top surface of the first oxide film pattern is removed.

* * * * *